United States Patent
Shiotsuka (10) Patent No.: US 6,400,193 B1
(45) Date of Patent: Jun. 4, 2002

(54) HIGH SPEED, HIGH CURRENT AND LOW POWER CONSUMPTION OUTPUT CIRCUIT

(75) Inventor: Hiroyuki Shiotsuka, Gunma (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/860,180

(22) Filed: May 17, 2001

(51) Int. Cl.[7] .............................................. H03K 3/00
(52) U.S. Cl. ...................................... 327/112; 327/333
(58) Field of Search ................................ 327/108, 111, 327/112, 333, 478; 326/89, 90, 91

(56) References Cited

U.S. PATENT DOCUMENTS

| | | | | |
|---|---|---|---|---|
| 4,021,684 A | * | 5/1977 | Macey ......................... | 327/108 |
| 5,550,501 A | * | 8/1996 | Ito et al. ..................... | 327/112 |
| 5,699,001 A | | 12/1997 | Awaji et al. | |
| 5,781,059 A | | 7/1998 | Shiotsuka | |
| 5,801,558 A | * | 9/1998 | Freyman et al. ............. | 327/112 |
| 5,898,326 A | | 4/1999 | Okayasu | |
| 6,094,085 A | | 7/2000 | Okayasu et al. | |
| 6,104,218 A | * | 8/2000 | Masaji ........................ | 327/108 |
| 6,184,728 B1 | * | 2/2001 | Nobuhiro ..................... | 327/108 |

* cited by examiner

Primary Examiner—Toan Tran
(74) Attorney, Agent, or Firm—Muramatsu & Associates (57) ABSTRACT

An output circuit capable of high-speed operation, large current output, and low power consumption. The output circuit includes an input transistor for receiving an input signal, a pair of output transistors for supplying an output signal to the load at a desired current level, a resistor network provided between the output transistors, a level shift circuit for shifting a bias voltage of the input transistor to determine a bias voltage of the output transistors thereby defining bias current in the output transistors, and an inverse current circuit for supplying a current to the resistor network which is opposite to the current supplied from the output transistor when the output current from one of the output transistors to the load exceeds the predetermined value.

9 Claims, 8 Drawing Sheets

HIGH SPEED, HIGH CURRENT AND LOW POWER CONSUMPTION OUTPUT CIRCUIT

FIELD OF THE INVENTION

This invention relates to an output circuit used in the last stage of a driver circuit or an amplifier circuit of semiconductor components, and more particularly, to an output circuit having the capability of high speed and high current output operation, as well as low power consumption in a steady state. The output circuit of the present invention can be advantageously implemented as a driver in a semiconductor test system for accurately driving the input pins of the semiconductor device under test, however, the present invention can also be effectively applied to an output stage of general purpose electronic circuits.

BACKGROUND OF THE INVENTION

In testing semiconductor devices such as ICs and LSIs by a semiconductor test system such as an IC tester, a semiconductor device to be tested is provided with test signals (test patterns) formed by IC testers at its appropriate device pins at predetermined test timings. The IC tester then receives the output signals from the device under test produced in response to the test signals. The output signals are sampled by the strobe signals at predetermined timings and then compared with the expected data to determine whether the device under test performs the intended functions correctly.

The test signal waveforms applied to the device under test via driver are precisely controlled their voltage values as well as timings of rising and falling edges depending on the types and test purposes of the particular device under test. Therefore, in order to accurately transmit the test signal waveforms to the device under test, the output circuit must be able to operate at high speed and with large currents. Further, the recent semiconductor devices have input and output pins of several hundreds or more, thus, the semiconductor test system must also have test channels of several hundreds or more. As a result, each output circuit of the driver to have lower power consumption is crucial to the contribution of low power consumption in the test system as a whole.

The output circuit of the present invention is not limited to the application of the above noted semiconductor test system, and thus, can be widely used in the output stage of various electronic circuits and effectively used in, for example, output stages of amplifier circuits. However, for convenience of illustration, the present invention is described below in the case where it is applied to a semiconductor test system.

Figure 1:
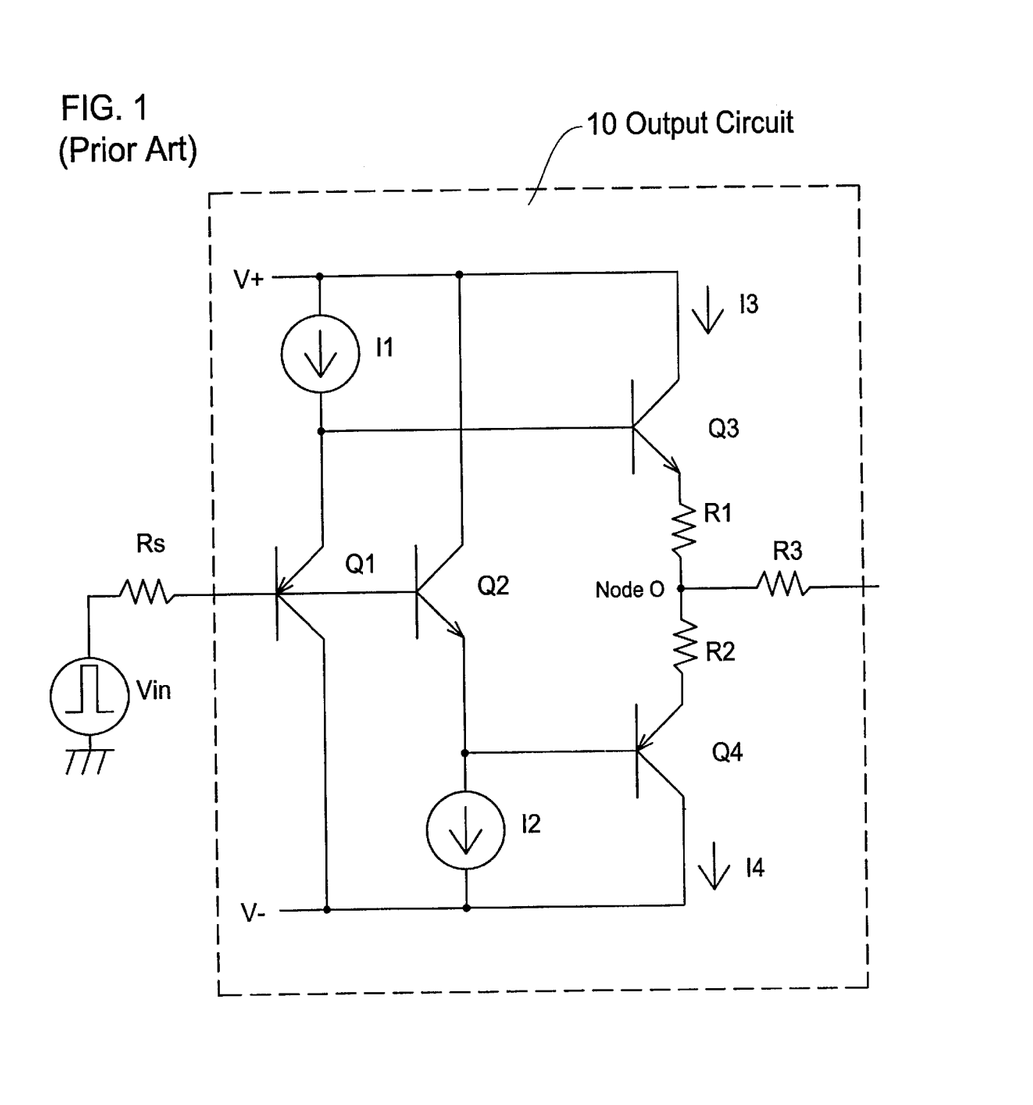
FIG. 1 is a circuit diagram showing an example of the basic structure of an output circuit such as a driver or an amplifier circuit in the conventional technology.

Such an output circuit of conventional technology is shown in FIG. 1. This is a typical example of a circuit structure requiring current drive capability, such as a driver circuit or an amplifier circuit. In the example of FIG. 1, an output circuit 10 is comprised of an input unit consisting of transistors Q1 and Q2, an output unit consisting of transistors Q3 and Q4, constant current sources for flowing currents I1 and I2, as well as resistors R1, R2, and R3. The output circuit 10 supplies, for example, test signals to a semiconductor device under test with a predetermined current value under a predetermined output impedance.

In such an application in a semiconductor test system for testing a semiconductor device which requires high speed operations, large output current, and low power consumption, it is difficult to satisfy all of such requirements by the conventional circuit structure shown in the drawing. Specific examples of such problems will be explained in the following. Here, it is assumed that the maximum current output supplied to a load, for example, an input pin of the semiconductor device under test, from the output circuit is 70 mA (milliampere) and output impedance of the output circuit is 50 Ω(ohms).

Case 1

This is a case where the output circuit is designed to achieve low power consumption as a primary objective. In this case, resistance of resistors R1 and R2 in the last stage are set to zero, i.e., R1=R2=0 Ω, currents I3 and I4 in the steady state of the transistors Q3 and Q4 are set to 10 mA, i.e., I3=I4=10 mA, and currents I1 and I2 at the steady state of the transistors Q1 and Q2 are set to 5 mA, i.e., I1=I2=5 mA. In this setting, since a transistor junction of each of the transistors Q3 and Q4 need to be large enough in order to operate at the maximum current output of 70 mA. Thus, the physical size of the transistors Q3 and Q4 must be large.

In this circuit structure, a voltage Vbe between the base and the emitter of the transistor Q1 and a voltage Vbe between the base and the emitter of the transistor Q3 become equal to each other, and a voltage Vbe between the base and the emitter of the transistor Q2 and a voltage Vbe between the base and the emitter of the transistor Q4 also become equal to each other. Further, generally in a transistor, the following relationship is known between emitter (collector) current I, a voltage Vbe between a base and an emitter, and saturation current Is (K is constant):

$$I = I_s \cdot \exp(KVbe) \tag{1}$$

The saturation current Is mentioned here is known to be a function of a physical size of a transistor junction. A transistor which is necessary to flow a large current has a large saturation current Is, resulting in a large physical size. Even when these transistors Q3 and Q4 in the last stage have to flow a large current, these transistors still have a current gain (amplification factor) of several tens or so, making it unnecessary for the input transistors Q1 and Q2 to drive a large current.

However, in order for the voltage Vbe between the base and emitter of the transistor Q1 to be equal to the voltage Vbe between the base and emitter of the transistor Q3 when flowing the current 5 mA, the transistor Q1 must have a saturation current Is which is half of the transistor Q3 under the equation (1). The transistor Q1, therefore, has to be physically large which can operate at 35 mA. The relationship between transistors Q2 and Q4 is the same as that of the transistors Q1 and Q3. As a result, the transistors Q1 and Q2 become large transistors which can operate at 35 mA, although they only need to drive 5 mA. Since transistors having a large physical size typically have large stray capacitance and parasitic capacitance, and therefore are not suitable for high-speed operations.

Case 2

This is a case where the output circuit is designed to achieve a high speed operation as a primary objective. In this case, the resistors R1 and R2 are set to R1=R2=0 Ω, and the currents I1 and I2 are set to I1=I2=5 mA, and the transistors Q3 and Q4 are to operate at the maximum current of 70 mA like the case 1 above. In the case 2, it is assumed that the transistors Q1 and Q2 are optimized for flowing the current value of 5 mA. In other words, the transistors Q1 and Q2 are formed in the minimum required size sufficient to drive the current value of 5 mA. Thus, the physical size of the transistors Q1 and Q2 can be ½ of the physical size mentioned in the case 1 where the transistors Q1 and Q2 are sized to drive the current value of 35 mA. Since parasitic capacity is smaller and conductive paths are shorter in the transistors Q1 and Q2, a high-speed operation is possible.

Here, the small size of the transistors Q1 and Q2 means that the saturation current Is is also small, and thus, a voltage Vbe between the base and emitter has to be larger than that of the case 1 in order to drive the current value of 5 mA. Hence, the voltage Vbe between the base and emitter of each of the transistors Q3 and Q4 becomes large accordingly. As a consequence, a large current will flow through the transistors Q3 and Q4 even when there is no load is provided at the output, which contradicts the reduction of power consumption.

Case 3

This is a case where the output circuit is designed to achieve both the high speed operation and the lower power consumption as a primary objective. In order to achieve the high speed operation and low consumption power, the currents I3 and I4 are set to I3=I4=10 mA, the current I1 and I2 are set to I1=I2=5 mA, and the transistors Q1, Q2, Q3, and Q4 are the same as in the case 2 above. In order to satisfy this relationship, the difference between the voltages Vbe of the transistors Q1 and Q2 and the voltage Vbe of the transistors Q3 and Q4 is offset by voltage drops across the resistors R1 and R2. In other words, the sum of the voltage Vbe between the base and emitter of the transistor Q3 and the voltage across the resistor R1 has to be equal to the voltage Vbe between the base and emitter of the transistor Q1. Similarly, the sum of the voltage Vbe between the base and emitter of the transistor Q4 and the voltage across the resistor R2 has to be equal to the voltage Vbe between the base and emitter of the transistor Q2. In order to satisfy this relationship, resistance value of the resistors R1 and R2 becomes, for example, approximately 6 ohms.

In this case, both high-speed operation and low power consumption can be achieved in the output circuit. However, this configuration has a problem in that the output impedance rapidly increases when the output current value becomes large. As explained above, this circuit assumes that the maximum current of 70 mA can be supplied from the output transistors to the load. When the output current value from one of the output transistors exceeds a certain value, then the other output transistor cannot be sufficiently forward biased because of the voltage drop across the resistance, which causes the other output transistor to turn off.

For example, when this output current value exceeds 30 mA in a positive direction (from the power source V+ to the load via the transistor Q3), the voltage drop caused by the current and the resistor R1 becomes large, lowering the electric potential of the node O in FIG. 1 and turning the transistor Q4 off. Similarly, when the current value exceeds 30 mA in a negative direction (from the load to the power source V− via the transistor Q4), the voltage drop caused by the current and the resistor R2 becomes large, increasing the electric potential of the node O and turning the transistor Q3 off.

When both of the transistors Q3 and Q4 are on, the output impedance of the output circuit is equal to a parallel connection of two series circuit (1) and (2) where the series circuit (1) is a series connection of the output resistance of the transistor Q3 and the resistor R1 and the series circuit (2) is a series connection of the output resistance of the transistor Q4 and the resistor R2. However, when one of the transistors is turned off, the output impedance value as a whole becomes only one of the series circuit (1) or (2), and that impedance value, for example, will be twice as much as that when the two transistors are on. Due to this, a precise test signal cannot be supplied to the load, such as a semiconductor device under test.

SUMMARY OF THE INVENTION

Therefore, it is an object of the present invention to provide an output circuit which is capable of high-speed operation, large output current generation, as well as low power consumption to be used at an output stage of various electronic circuits.

It is another object of the present invention to provide an output circuit that can be advantageously used in an output stage of a driver circuit of a semiconductor test system in order to supply test signals to semiconductor devices under test.

It is a further object of the present invention to provide an output circuit which is capable of achieving high-speed operation, large current output generation, as well as low power consumption all at the same time, and can be fabricated in a small circuit scale at low cost.

The output circuit of the present invention uses transistors of large current operation only for the last stage transistors, and transistors of small current and high-speed operation for other transistors. The difference in the base-emitter voltage between those different types of transistor is offset by a voltage drop across a resistor network. The output circuit further includes an inverse current circuit for supplying an inverse current to compensate the voltage drop across the resistor network.

Accordingly, the output circuit of the present invention is a circuit for converting the input signal to an output signal of desired current level and supplying the output signal to the load. The output circuit of the present invention is used in an output stage of an electronic circuit. The output circuit includes an input transistor for receiving an input signal, a pair of output transistors for supplying an output signal to the load at a desired current level, a resistor network provided between the output transistors and having a connection point for supplying the output current to the load, a level shift circuit for shifting a bias voltage of the input transistor to determine a bias voltage of the output transistors thereby defining bias current in the output transistors, and an inverse current circuit for supplying a current to the resistor network which is opposite to the current supplied to the resistor network from the output transistor when the output current from one of the output transistors to the load exceeds the predetermined value.

In the embodiment of the present invention, the output circuit includes a constant current source for supplying a constant current to the input transistor and the level shift circuit. Preferably, the pair of output transistors mentioned above are structured in a complementary type circuit where one is an NPN transistor and the other is a PNP transistor. Further, the inverse current circuit mentioned above is preferably a pair of transistors of complementary form where one is an NPN transistor and the other is a PNP transistor.

Furthermore, in the embodiment of the present invention, the input transistor is structured as a pair of complementary transistors biased to establish a voltage difference of zero volt between the output voltage and the input voltage in the no-load condition. Alternatively, the input transistor is configured by either an NPN transistor or a PNP transistor which is biased in order to have a predetermined positive or negative voltage difference between the output voltage and the input voltage.

Furthermore, in the embodiment of the present invention, a current prevention means is provided to prevent unnecessary current from flowing in the inverse current circuit mentioned above. This current prevention means is structured by a pair of diodes connected to the output transistors and a pair of voltage shift means connected to the inverse current circuit.

According to the present invention, the output circuit is capable of high-speed operation and large output current generation, as well as low power consumption and being used as an output stage of various electronic circuits. Therefore, in a semiconductor test system, for example, the output circuit of the present invention can be advantageously applied to an output stage of the driver circuit for supplying test signals to the semiconductor device under test. The output circuit of the present invention can achieve the goals of high-speed operation, large current output, and low consumption power all at the same time at low cost and compact circuit structure.

DETAILED DESCRIPTION OF THE INVENTION

Figure 2:
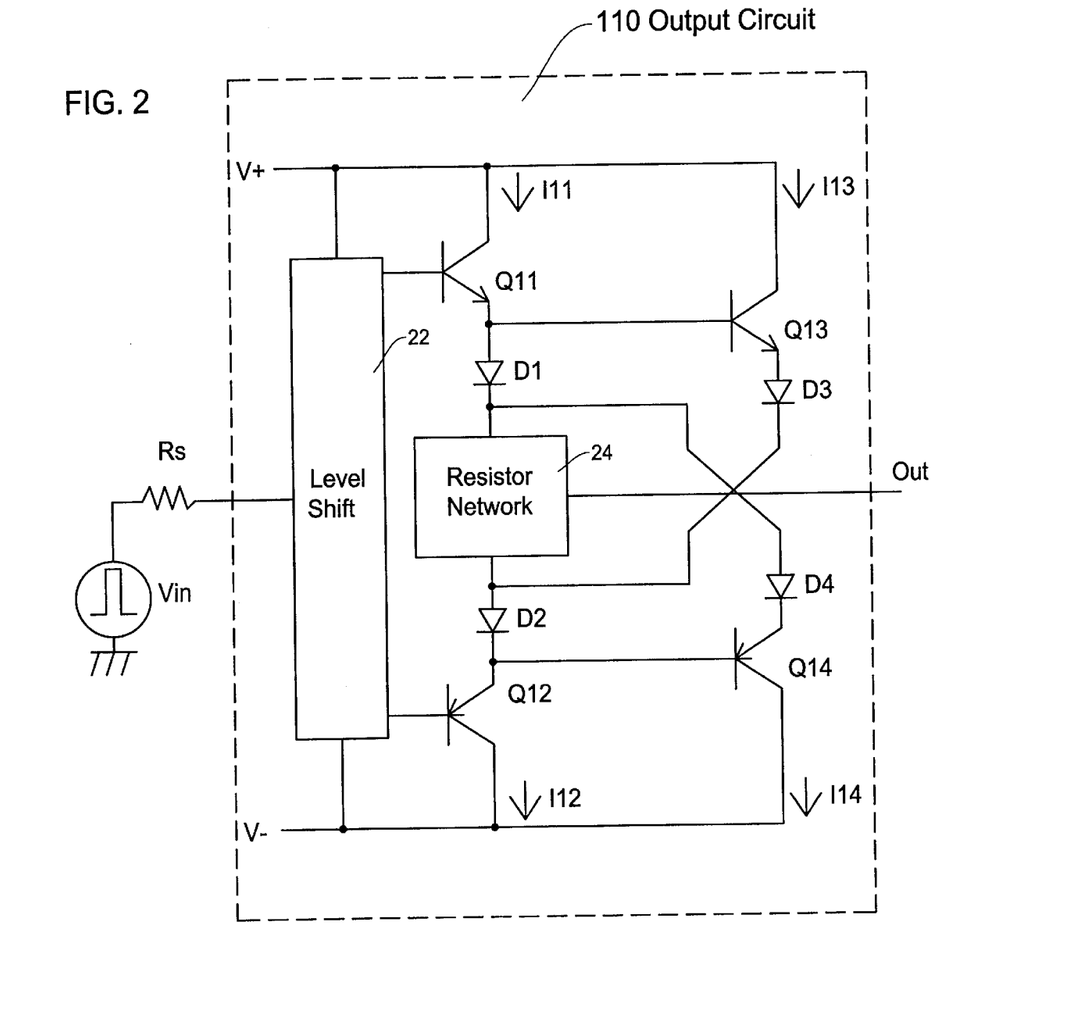
FIG. 2 is a schematic diagram showing an example of a structure of the output circuit of the present invention for use in an output stage of a driver or an amplifier.

FIG. 2 shows an example of the basic structure of the output circuit of the present invention. In this example, an output circuit 110 is comprised of a level shift circuit 22, a resistor network 24, transistors Q11, Q12, Q13, and Q14, and diodes D1, D2, D3, and D4.

The transistors Q11 and Q12 are last stage transistors corresponding to the transistors Q3 and Q4 in FIG. 1 for supplying the output current to the load. Therefore, the transistors Q11 and Q12 are physically large in size for driving a relatively large current such as 70 mA. Further, in this example, the transistors Q11 and Q12 are structured in a complementary form, where Q11 is an NPN transistor and Q12 is a PNP transistor.

The resistor network 24 determines the output impedance value of the output circuit 110. The resistor network 24 also decreases the steady state current (bias current) of the transistors Q11 and Q12 by a voltage drop across the resistor by the current flowing through the transistors Q11 and Q12. Therefore, the resistor network 24 can achieve a function similar to the resistors R1 and R2 explained in the case 3 with reference to FIG. 1. An example of specific circuit will be explained later with reference to FIGS. 3–5 and 7.

The level shift circuit 22 shifts the level of the DC bias voltage to an appropriate DC level when the input voltage is zero, and transmits the bias voltage to the transistors Q11 and Q12. In addition to this level shift function, the level shift circuit 22 also achieves a buffer function for supplying input signals Vin to the transistors Q1 and Q2 of FIG. 1. An example of specific circuit and modified version will be explained later with reference to FIGS. 3–5 and FIGS. 8–9, respectively.

The transistors Q13 and Q14 perform a function for controlling the voltage drop across the resistor network 24. The transistors Q13 and Q14 configure an inverse current circuit for preventing the transistors Q11 and Q12 from being turned off, even if a large current flows through the transistor Q11, Q12, and the resistor network 24. In this example, such an inverse current circuit is established by a pair of transistors structured in a complementary form, where Q13 is an NPN transistor and Q14 is a PNP transistor. The diodes D1, D2, D3, and D4 create a current prevention means for preventing unnecessary current from flowing to the transistors Q13 and Q14. These diodes can be structured with use of base/emitters of transistors.

The output circuit 110 of the present invention requires only the last stage of transistors Q11 and Q12 to be physically large in size for driving large currents, and the other transistors can be small in size with high operational speed. In addition, the transistors Q11 and Q12 can remain in the conductive condition even when the current value flowing therethrough is large, and thus, can also maintain the constant level of the output impedance of output circuit 110. Accordingly, input signal waveforms (such as test signals) can be accurately transmitted to the load (such as input pins of the semiconductor device under test) from the output circuit of the present invention.

Figure 3:
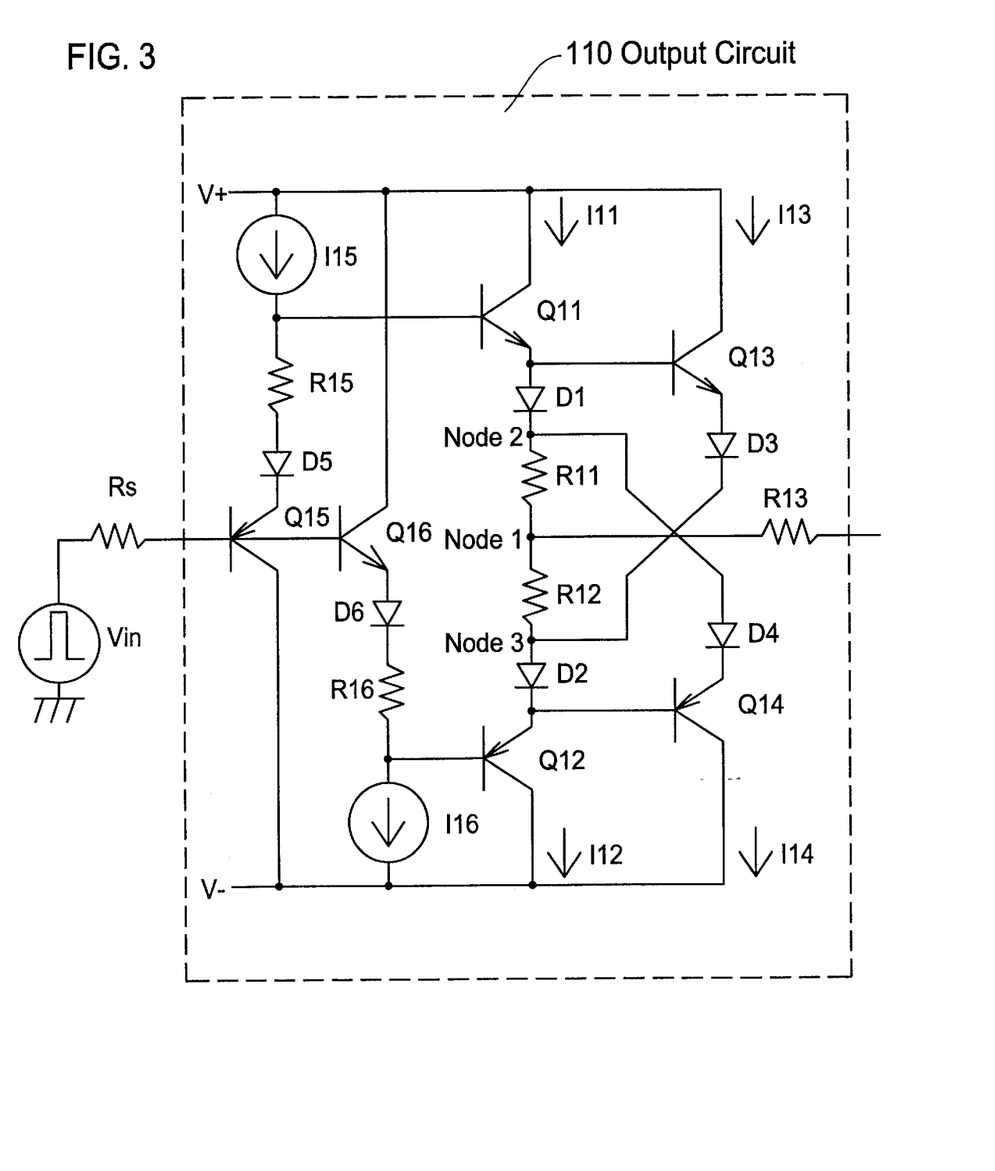
FIG. 3 is a circuit diagram showing an example of a more detailed structure of the output circuit of the present invention shown in FIG. 2.

FIG. 3 is a circuit diagram showing a more detailed structure of the output circuit 110 of the present invention. Here, detailed structures of the level shift circuit 22 and the resistor network 24 are included in the drawing. The level shift circuit 22 is structured with transistors Q15 and Q16, resistors R15 and R16, diodes D5 and D6, and constant current sources I15 and I16. Therefore, compared to the structure in the input portion in the conventional technology shown in FIG. 1, the difference is the addition of the resistors R15 and R16 and the diodes D5 and D6 for level-shifting. Also, in this example, the resistor network 24 is comprised of the resistors R11 and R12. The diodes DS and D6 can be structured with use of base/emitters of transistors.

In this example of FIG. 3, the resistors R11 and R12 have, for example, the same resistance value, and are symmetrically structured with respect to a node 1. The resistance value of the resistors R11 and R12 is determined in such a way that, when the constant current, such as 10 mA, is flowing through the transistors Q11 and Q12 in a no-load condition, transistors Q13 and Q14 are slightly conductive. The amount of voltage shift achieved by the transistors Q15 and Q16, the diodes D5 and D6, and the resistors R15 and R16 is determined in such way that the voltage shift is able to achieve an intended amount of current flowing through the transistors Q11 and Q12, such as 10 mA, under the no-load condition.

Figure 4:
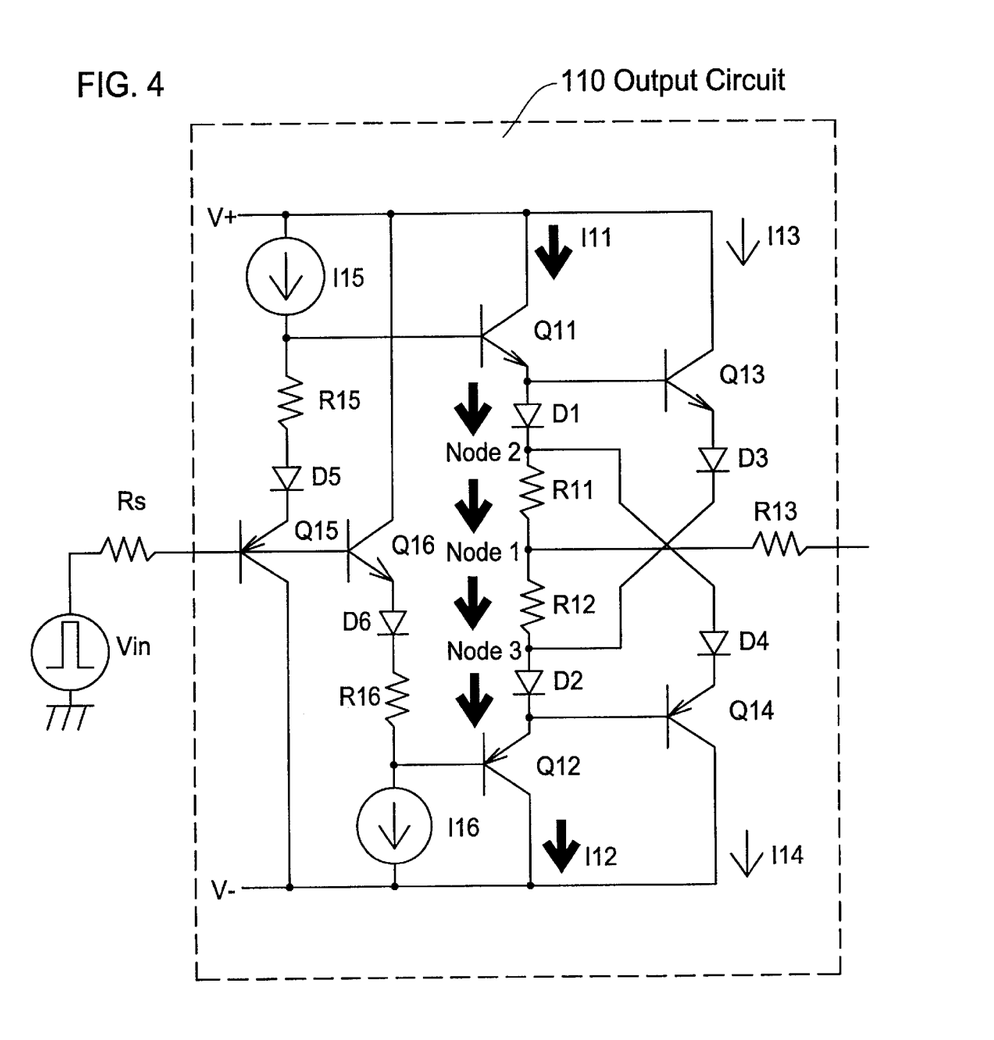
FIG. 4 is a circuit diagram showing current flows at various components in the output circuit of the present invention shown in FIG. 3 when an output current to the load is zero.

Under the above noted situation, the circuit diagram of FIG. 4 shows the current in each location in the output circuit 110 under the no-load condition (i.e., the current flowing through the resistor R13 is zero). The current value of the constant current sources I15 and I16 are, for example, 5 mA. The steady state current of the transistors Q11 and Q12 in the no-load condition is, for example, 10 mA. In this situation, the voltage difference between the base of the transistor Q15 and the base of the transistor Q11 via the emitter of the transistor Q15, the diode D1, and the resistor R15, is equal to the voltage difference between the base of the transistor Q11 and the node 1 via the emitter of the transistor Q11, the diode D1, and the resistor R11. Similarly, the voltage difference between the base of the transistor Q16 and the base of the transistor Q12 via the emitter of the transistor Q16, the diode D6, and the resistor R16 is equal to the voltage difference between the base of transistor Q12 and the node 1 via the emitter of the transistor Q12, the diode D2, and the resistor R12.

Figure 5:
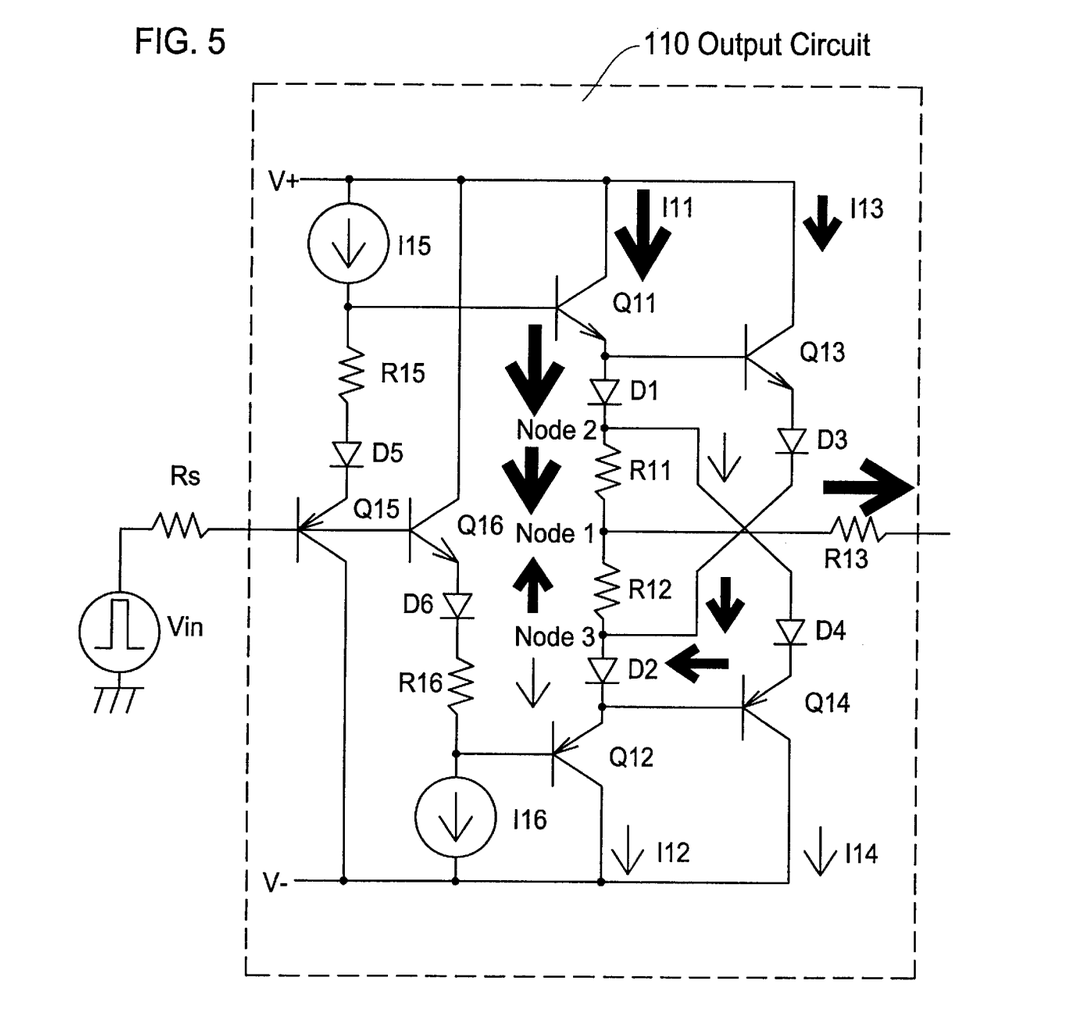
FIG. 5 is a circuit diagram showing current flows at various components in the output circuit of the present invention shown in FIG. 3 when a large output current is supplied to the load.

FIG. 5 shows the current in each location in the output circuit 110 in the situation where an input signal is applied and, as a result, a large current is supplied to the load from the output circuit 110. When the current supplied from the transistor Q11 to the load is large, the electric potential of the node 1 decreases by the voltage drop across the resistor R11. At this time, since the resistor R12 near the node 3 is connected to the diode D3, an inverse current flows in the resistor R12 through the transistor Q13. Because of the inverse current, the transistor Q12 is prevented from becoming a reverse bias situation because the increase in the electric potential at the node 3. As a result, since the transistor Q12 is prevented from being turned off even if the transistor Q11 supplies a large current, the output impedance of the output circuit 110 can maintain the constant value.

Similarly, when the current pulled into the transistor Q12 from the load is large, the electric potential of the node 1 increases by the voltage drop of across the resistor R12. At this time, since the resistor R11 near the node 2 is connected to the diode D4, an inverse current flows in the resistor R11 via the transistor Q14. Because of this inverse current, the transistor Q11 is prevented from becoming a reverse bias situation by decreasing the electric potential at the node 2. As a result, since the transistor Q11 is prevented from being turned off even if the transistor Q12 flows a large current, the output impedance of the output circuit 110 can maintain the constant value.

Therefore, the output circuit of the present invention can fulfill the requirements of the high-speed operation, low consumption power, and large current output all at the same time. Here, the diodes D1, D2, D3, and D4 are established to prevent unnecessary current from flowing to the transistors Q13 and Q14. These diodes can also be structured by transistors. Further, since the diodes D3 and D4 function to produce a predetermined voltage shift, they can be replaced with resistors.

Figure 6:
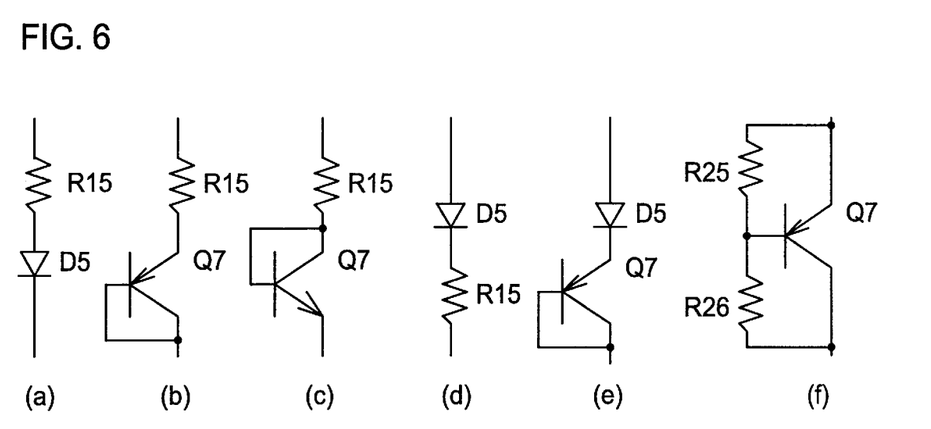
FIGS. 6(a)–(f) are circuit diagrams showing various possible structures to be used as a level shift circuit in the output circuits of FIGS. 3–5.
Figure 7:
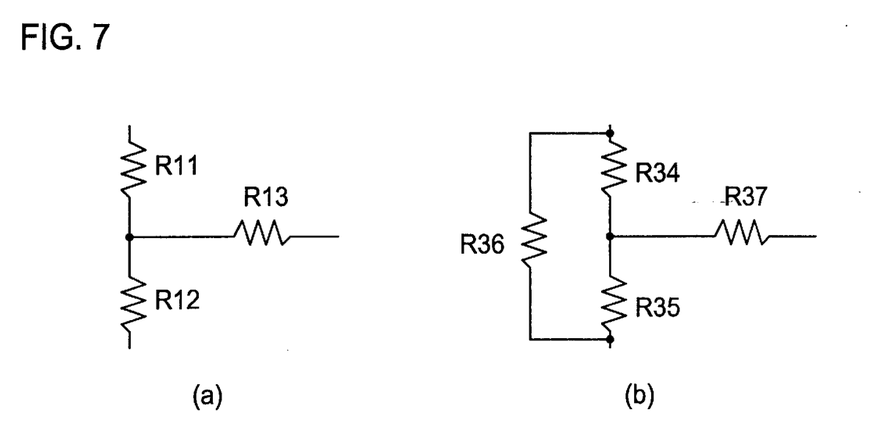
FIGS. 7(a)–7(b) are circuit diagrams showing examples of structure in a resistance network for determining the output impedance in the output circuits of FIGS. 3–5.

FIGS. 6(a)–(f) respectively show modified examples of the level shift circuit formed with the diode D5 and resistor R15, and the diode D6 and resistor R16 in FIGS. 3–5. In the example of FIGS. 3–5, the diode D5 and the resistor R15 are structured as shown in FIG. 6(a). With the same goal in mind, various modifications are possible some of which are shown in FIGS. 6(b)–6(f) that can replace the example of FIG. 6(a). Although not shown here, other various circuit structures can also be used, for example, a level shift circuit using a Zener diode.

FIGS. 7(a) and 7(b) respectively show examples of the resistor network structure. In the example of FIGS. 3–5, the structure shown in FIG. 7(a) is being used, however, it can be replaced with the structure shown in FIG. 7(b). It can also be replaced by other circuit structures not shown in the diagram. When applying the output circuit of the present invention, it is preferable that each resistance value of the output resistance of the transistor Q11 and Q12 and the resistance network be equal and symmetrical to one another with respect to the node 1 which is a connection point to supply the current to the load.

Figure 8:
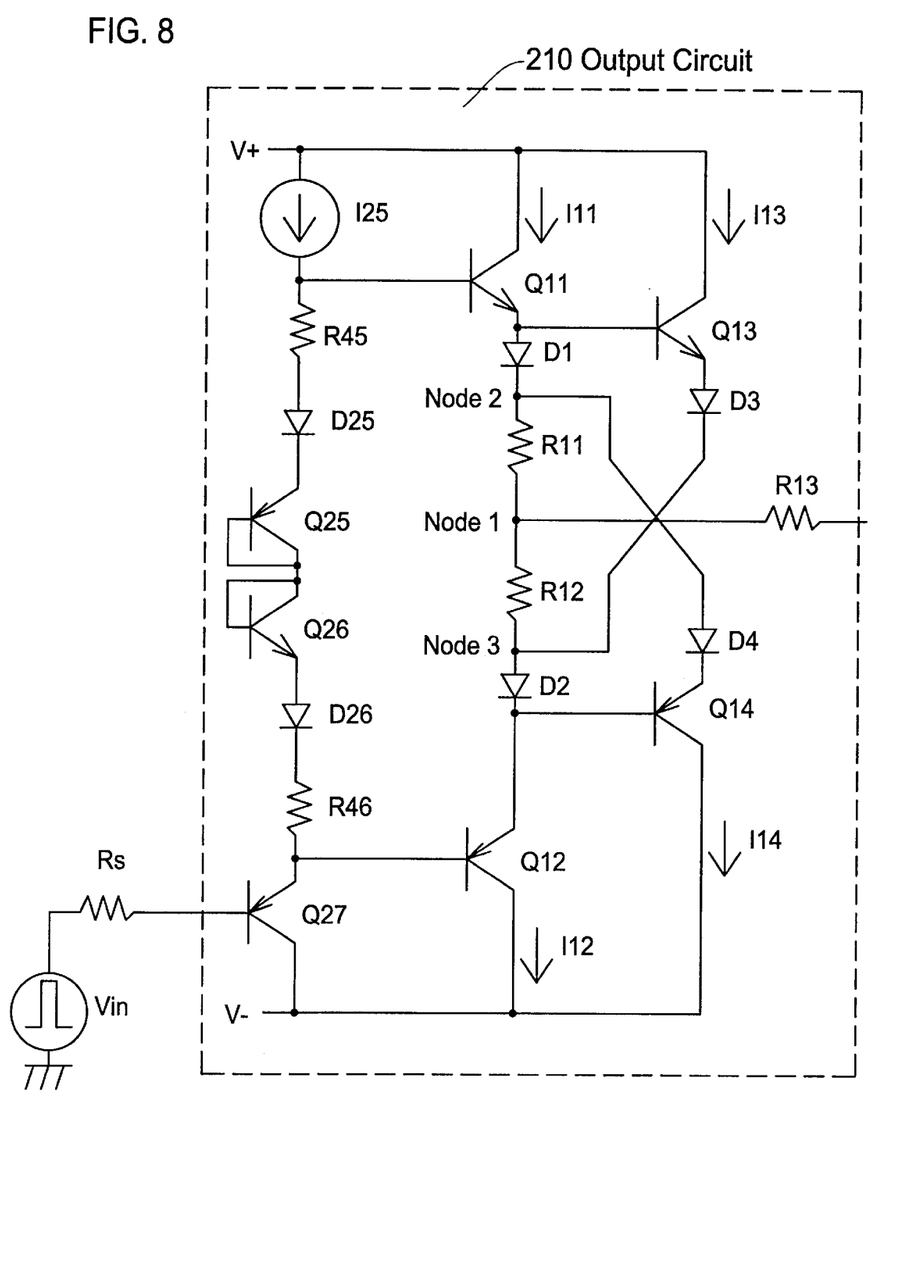
FIG. 8 is a circuit diagram showing a modified example of the output circuit of the present invention where the input circuit is provided at an unbalanced position.
Figure 9:
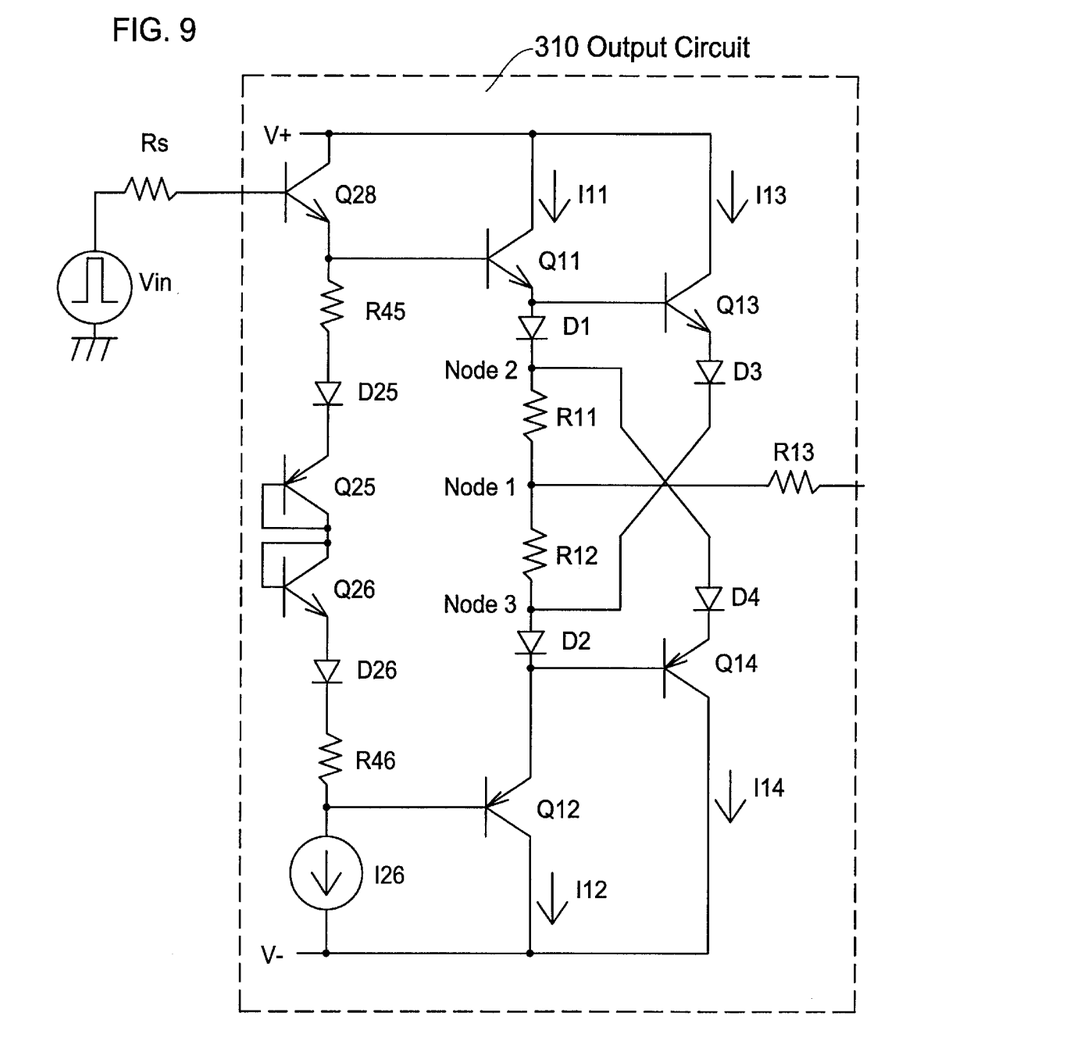
FIG. 9 is a circuit diagram showing another modified example of the output circuit of the present invention which is symmetrical to the example of FIG. 8.

FIG. 8 and FIG. 9 respectively show modified versions of the output circuit of the present invention. In the example of FIGS. 3–5, the input signals are provided to the output circuit 110 at an input reference voltage zero. In other words, the transistors Q15 and Q16 are biased to have a zero voltage difference between the output voltage and the input voltage during in the no-load condition. In contrast, in FIGS. 8 and 9, the output circuits are so designed to establish a predetermined voltage difference between the input voltage and the output voltage in the no-load condition where such a voltage difference is either a positive value or a negative value.

For example, in the case of FIG. 8, a set of level shift circuit is structured by a resistor R45, a diode D25, and a transistor Q25, and another set of level shift circuit is structured by a resistor R46, a diode D26, and a transistor Q26. The amount of voltage shift is determined by providing a current from a constant current source I25 to the level shift circuits, thereby defining the current values flowing in the transistors Q11 and Q12, as well as transistors Q13 and Q14. These transistors Q11, Q12, Q13, Q14, and the diodes D1, D2, D3, D4, and the resistors R11 and R12, are the same as those shown in the example of FIGS. 3–5. In this circuit structure, a PNP transistor is used for the input transistor Q27. Since the emitter of the transistor Q27 is biased in a negative voltage, an input signal supplied to the base will be shifted to a negative voltage as well.

FIG. 9 is opposite to the example of FIG. 8, and is the same in the circuit configuration except for the input portion which is in a positive voltage. By flowing the current from a constant current source I26 to the level shift circuit, the emitter of an input transistor Q28 is biased in a positive voltage. In this example, an NPN transistor is used for the transistor Q28. Therefore, an input signal provided to the base is shifted to a positive voltage as well.

As explained above, according to the present invention, the output circuit is capable of high-speed operation and large output current generation, as well as low power consumption and being used as an output stage of various electronic circuits. Therefore, in a semiconductor test system, for example, the output circuit of the present invention can be advantageously applied to an output stage of the driver circuit for supplying test signals to the semiconductor device under test. The output circuit of the present invention can achieve the goals of high-speed operation, large current output, and low consumption power all at the same time at low cost and with a compact circuit structure.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An output circuit for use at an output portion of an electric circuit for converting an input signal to an output signal of a desired current level and supplying the output signal to a load, comprising:

an input transistor for receiving an input signal;

a pair of output transistors for supplying an output signal to the load at a desired current level;

a resistor network provided between the output transistors and having a connection point for supplying the output current to the load;

a level shift circuit for shifting a bias voltage of the input transistor to supply bias voltage to the output transistors thereby defining bias current in the output transistors; and an inverse current circuit for supplying an inverse current to the resistor network which is opposite to the current supplied to the resistor network from the output transistor when the output current from one of the output transistors to the load exceeds a predetermined value.

2. An output circuit as defined in claim 1, further comprising a constant current source for supplying a constant current to the input transistor and the level shift circuit.

3. An output circuit as defined in claim 1, wherein said pair of output transistors are structured in a complementary type circuit where one is an NPN transistor and the other is a PNP transistor.

4. An output circuit as defined in claim 1, wherein said inverse current circuit is structured in a complementary type circuit where one is an NPN transistor and the other is a PNP transistor.

5. An output circuit as defined in claim 1, wherein said inverse current circuit is provided with a current prevention means for preventing unnecessary current from flowing in the inverse current circuit.

6. An output circuit as defined in claim 1, wherein said input transistor is structured as a pair of complementary transistors biased to establish a voltage difference of zero volt between the output voltage and the input voltage under a no-load condition.

7. An output circuit as defined in claim 1, wherein said input transistor is configured by either an NPN transistor or a PNP transistor which is biased in order to establish a predetermined positive or negative voltage difference between the output voltage and the input voltage.

8. An output circuit as defined in claim 1, wherein is said resistor network is symmetrical to the pair of output transistors with respect to the connection point.

9. An output circuit as defined in claim 5, wherein said current prevention means is structured by a pair of diodes connected to the output transistors and a pair of voltage shift means connected to the inverse current circuit.

* * * * *